(12) United States Patent
Nomoto et al.

(10) Patent No.: US 9,408,321 B2
(45) Date of Patent: Aug. 2, 2016

(54) SIDE-COUPLING-TYPE ELECTRONIC DEVICE UNIT

(71) Applicants: Hirokazu Nomoto, Tokyo (JP);
Nobuhiro Watanabe, Tokyo (JP);
Yusuke Kurose, Tokyo (JP)

(72) Inventors: Hirokazu Nomoto, Tokyo (JP);
Nobuhiro Watanabe, Tokyo (JP);
Yusuke Kurose, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/771,844

(22) PCT Filed: Mar. 7, 2013

(86) PCT No.: PCT/JP2013/056306
§ 371 (c)(1),
(2) Date: Sep. 1, 2015

(87) PCT Pub. No.: WO2014/136238
PCT Pub. Date: Sep. 12, 2014

(65) Prior Publication Data
US 2016/0029505 A1  Jan. 28, 2016

(51) Int. Cl.
*A47B 81/00* (2006.01)
*H05K 7/14* (2006.01)
*H05K 5/00* (2006.01)
*H05K 5/02* (2006.01)
*H05K 5/03* (2006.01)

(52) U.S. Cl.
CPC ............... *H05K 7/14* (2013.01); *H05K 5/0021* (2013.01); *H05K 5/0217* (2013.01); *H05K 5/03* (2013.01); *H05K 7/1474* (2013.01)

(58) Field of Classification Search
CPC .......... H05K 7/14; H05K 7/1474; E05C 1/00; E05C 1/004; E05C 1/02; E05C 1/04; E05C 1/08; E05C 1/10; E05C 9/02; E05C 19/10; E05B 15/022; E05B 65/5215; E05B 65/523; E05B 85/22
See application file for complete search history.

(56) References Cited

U.S. PATENT DOCUMENTS 5,194,693 A * 3/1993 Brzozowski ......... H05K 5/0021
174/50
5,701,232 A * 12/1997 Tang .................... G06F 1/1613
174/67

(Continued)

FOREIGN PATENT DOCUMENTS

JP  57-198143 U  12/1982
JP  06-230808 A  8/1994

(Continued)

OTHER PUBLICATIONS

Japanese Notice of Rejection issued in JP 2015-504067 dated Apr. 15, 2015.

(Continued)

*Primary Examiner* — Hanh V Tran
(74) *Attorney, Agent, or Firm* — Sughrue Mion, PLLC

(57) ABSTRACT

A guide groove has two protrusions on a side face, and a slider has three concave grooves, into which the two protrusions are capable of being fitted, on a sidewall. When the slider is located at a lock position, the two protrusions are fitted into two of the three concave grooves on one end side of the guide groove to restrict movement of the slider. When the slider is located at an unlock position, the two protrusions are fitted into two of the three concave grooves on the other end side of the guide groove to restrict movement of the slider.

5 Claims, 9 Drawing Sheets

(56) References Cited

U.S. PATENT DOCUMENTS

| | | | | |
|---|---|---|---|---|
| 5,841,639 A | * | 11/1998 | Schnoor | H05K 7/1427 361/679.32 |
| 5,864,467 A | * | 1/1999 | Recchia | H05K 5/0021 174/561 |
| 5,913,926 A | * | 6/1999 | Anderson | G06F 1/184 360/98.01 |
| 9,276,349 B2 | * | 3/2016 | Yoshida | H05K 7/1474 |
| 2003/0217495 A1 | * | 11/2003 | Nagamine | G06F 9/00 40/605 |
| 2007/0140234 A1 | * | 6/2007 | Hwang | H05K 5/0021 370/389 |
| 2007/0217126 A1 | * | 9/2007 | Tsai | H05K 5/0217 361/600 |
| 2010/0072041 A1 | * | 3/2010 | Zuo | H01H 15/06 200/17 R |
| 2012/0206876 A1 | * | 8/2012 | Chen | H05K 5/0021 361/679.58 |
| 2013/0175909 A1 | * | 7/2013 | Wang | G06F 1/1626 312/223.1 |

FOREIGN PATENT DOCUMENTS

| | | |
|---|---|---|
| JP | 11-168284 A | 6/1999 |
| JP | 2001-060773 A | 3/2001 |
| JP | 2003-125052 A | 4/2003 |
| JP | 2003-298251 A | 10/2003 |
| JP | 2003-329016 A | 11/2003 |

OTHER PUBLICATIONS

International Search Report of PCT/JP2013/056306 dated Jun. 4, 2013.

* cited by examiner

SIDE-COUPLING-TYPE ELECTRONIC DEVICE UNIT

FIELD

The present invention relates to a structure for locking or unlocking electronic device units with a coupling hook when the electronic device units are coupled with each other in a lateral direction, at the time of constructing a system by lateral coupling.

BACKGROUND

Conventionally, as an electronic device unit for constructing a system where the electronic device units are attached to a DIN (Deutsche Industrie Normen)-standard rail and coupled with each other in a lateral direction, there is an electronic device unit having a casing configured by a box-like case without a lid and a lid-like lock/unlock component having a slider mechanism.

The case is provided with an L-shaped coupling hook on an outer coupling surface, and the lock/unlock component is provided with a slider and an engagement hole. The coupling hook of the case of one of the electronic device units is inserted into the engagement hole of the lock/unlock component of the other electronic device unit, and the slider is moved to a lock position, thereby causing the slider located between the coupling hook and the engagement hole to function as a bolt. Further, by moving the slider to an unlock position, the slider is released from a space between the coupling hook and the engagement hole, and the electronic device units can be separated from each other.

In the conventional technique described above, for the sake of fixing the slider to the lock position, an arm is provided on the slider, and a stepped shape is formed on the case. At the time of sliding the slider to a lock position, the tip of the arm runs over the step of the case and drops down into a concave part, by which the slider is fixed at the lock position.

Patent Literature 1 also discloses a side-coupling type programmable controller unit where fitting positions between a click-stop protrusion of a lock slider and two click-stop concave parts of the electronic device unit body are changed so as to switch between lock and unlock.

CITATION LIST

Patent Literature

Patent Literature 1: Japanese Patent Application Laid-open No. H6-230808

SUMMARY

Technical Problem

However, according to the conventional technique described above in which the arm is provided on the slider, elastic deformation the extent of which the tip runs over the step is realized by the elasticity of resin, and thus it is necessary to configure the arm to have a certain length. Therefore, there is a problem that it is required to ensure a large space for fixing the slider at a lock position and to form a special shape on the case. Further, as the slider is larger in size, a printed board has a narrower component mounting space. On the other hand, there is a problem that it is difficult to form a durable shape from the viewpoint of preventing that the component mounting space of the printed board becomes narrow since the arm length cannot be ensured if it is attempted to suppress the space for fixing the slider.

Further, there is a problem in that shape flexibility is limited due to such a structure that the strength is ensured by the arm having a thickness equal to or larger than a certain thickness.

The invention disclosed in Patent Literature 1 where the click-stop protrusion is provided on the lock slider side has a problem in that it is difficult to suppress the thickness of the lock/unlock component in a case that the lock slider is formed elastically deformable.

The present invention has been achieved in view of the above problems, and an object of the present invention is to provide a side-coupling-type electronic device unit having high durability and less restriction in the internal degree of freedom thereof.

Solution to Problem

According to an aspect of the present invention in order to solve the above mentioned problems and achieve the object, there is provided a side-coupling-type electronic device unit includes: a casing including a coupling hook provided projectingly on a coupling surface to be coupled with another electronic device unit; an engagement hole into which a coupling hook of the another electronic device unit is capable of being inserted; and a guide groove; and a slider that includes a bolt, that is installed in the guide groove, and that moves between a lock position located at one end side of the guide groove at which the bolt is capable of blocking insertion and removal of the coupling hook of the another electronic device unit into and from the engagement hole, and an unlock position located at another end side of the guide groove at which the bolt is not capable of blocking insertion and removal of the coupling hook of the another electronic device unit into and from the engagement hole. The guide groove has two convex shaped portions on a side face thereof, the slider has three concave shaped portions, into which the two convex shaped portions are capable of being fitted, on a side face thereof, when the slider is located at the lock position, the two convex shaped portions are fitted into two of the three concave shaped portions on one end side of the guide groove so as to restrict movement of the slider, and when the slider is located at the unlock position, the two convex shaped portions are fitted into two of the three concave shaped portions on the other end side of the guide groove so as to restrict movement of the slider.

Advantageous Effects of Invention

The side-coupling-type electronic device unit according to the present invention has high durability in coupling components thereof and has less restriction in the internal degree of freedom thereof.

DESCRIPTION OF EMBODIMENTS

A side-coupling-type electronic device unit according to embodiments of the present invention will be described below in detail with reference to the accompanying drawings. The present invention is not limited to the embodiments.

Embodiment

Figure 1:
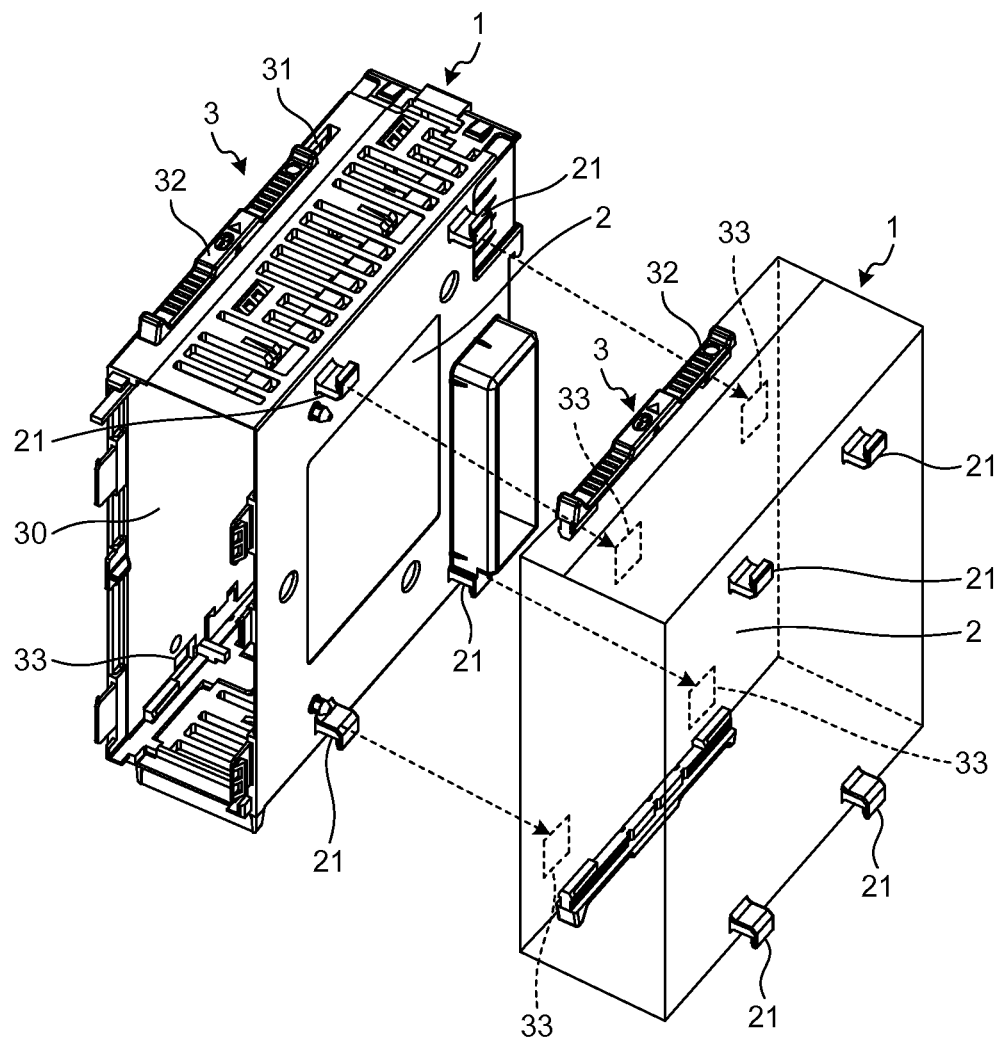
FIG. 1 is a diagram illustrating a configuration of a side-coupling-type electronic device unit according to an embodiment of the present invention.

FIG. 1 is a diagram illustrating a configuration of a side-coupling-type electronic device unit according to an embodiment of the present invention. An electronic device unit 1 has a box-like shape whose side face is opened, and includes a casing. The casing is configured by a case 2 having bent-shaped coupling hooks 21 projectingly provided outside of a coupling surface to be coupled with another electronic device unit 1, and a lid-like lock/unlock component 3 having a slider mechanism. The four coupling hooks 21 are provided respectively near four corners of the coupling surface to be coupled with another electronic device unit 1. The lock/unlock component 3 is a component for covering the opened side face of the case 2 and imparting a coupling function to be coupled with another electronic device unit for the electronic device unit 1. The lock/unlock component 3 has a lid body 30 including guide grooves 31, each having a substantially rectangular shape in cross section, and a slider 32 is installed in the guide groove 31. The guide grooves 31 are formed on an upper face and a lower face of the lid body 30 (the guide groove 31 on the lower face is not illustrated). The slider 32 has a substantially bar shape whose width is substantially same as that of the guide groove 31, and a cross-sectional surface of a portion (a body portion 321 described later) provided in the guide groove 31 has a substantially rectangular shape whose width is substantially same as that of the guide groove 31. The lid body 30 is formed with an engagement hole 33 into which the coupling hook 21 of another electronic device unit 1 is inserted. Two engagement holes 33 are provided on an upper part along the guide groove 31 with a gap therebetween and two engagement holes 33 are provided on a lower part, making four engagement holes 33 in total.

Figure 2:
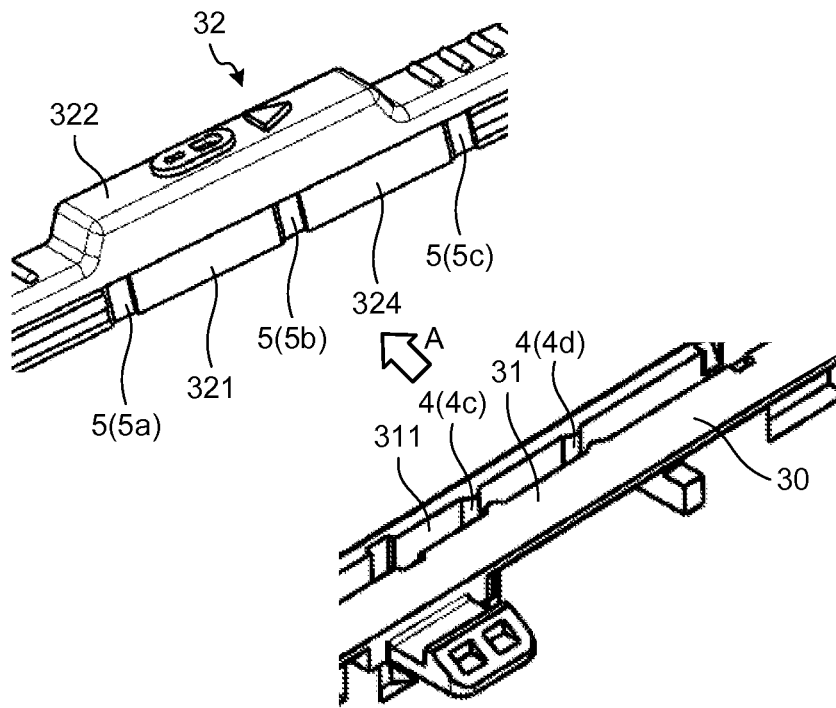
FIG. 2 is a partial enlarged diagram of a lock/unlock component.
Figure 3:
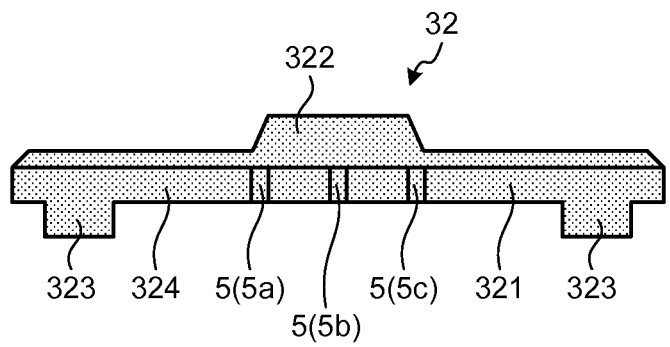
FIG. 3 is a schematic diagram illustrating a slider.

FIG. 2 is a partial enlarged diagram of the lock/unlock component and illustrates a state where the slider 32 is detached from the guide groove 31. One of side faces 311 of the guide groove 31 described later is not illustrated in FIG. 2 to facilitate understanding of the structure. FIG. 3 is a schematic diagram of the slider and illustrates a side face of the slider 32, as viewed from a direction of the arrow A in FIG. 2.

On the side face 311 of the guide groove 31, two protrusions 4 (4c, 4d) are formed as convex shaped portions. Two protrusions 4 (4a, 4b) are also provided on the side face 311 (not illustrated) although not illustrated in FIG. 2. The slider 32 has a body portion 321, an operation portion 322, and a bolt 323. The body portion 321 is a portion that fits into the guide groove 31 when the slider 32 is installed in the guide groove 31. In one of sidewalls 324 of the body portion 321, three concave grooves (5a, 5b, 5c) are provided as concave shaped portions. Although not illustrated in FIG. 2 and FIG. 3, three concave grooves (5d, 5e, 5f) are also provided in the sidewall 324, which is hidden behind the body portion 321 in FIG. 2 and FIG. 3. The operation portion 322 is formed on an upper side of a longitudinal center of the body portion 321. Two bolts 323 are formed to project downward from the body portion 321.

A gap between the concave groove 5a and the concave groove 5b, and a gap between the concave groove 5b and the concave groove 5c are equal to a gap between the protrusion 4a and the protrusion 4b. A gap between the concave groove 5d and the concave groove 5e, and a gap between the concave groove 5e and the concave groove 5f are equal to a gap between the protrusion 4c and the protrusion 4d. The operation portion 322 projects from the guide groove 31 when the slider 32 is installed in the guide groove 31. A gap between the bolts 323 is equal to the gap between the two engagement holes 33 provided along the same guide groove 31.

The slider 32 has a hollow structure, and the sidewalls 324 of the body portion 321 have flexibility. By applying a force in a direction along a longitudinal direction of the guide groove 31 to the operation portion 322 projecting from the guide groove 31, the slider 32 is moved along the guide groove 31 in a state that the body portion 321 is fitted into the guide groove 31. The slider 32 can is moved between a lock position located at one end side of the guide groove 31 and an unlock position located at the other end side thereof. As described later, when the slider 32 is positioned at an unlock position, the electronic device unit 1 is in a state (an unlock state) where the electronic device unit 1 can be coupled with another electronic device unit 1 which has not been coupled, or can be separated from another electronic device unit 1 which has been coupled. On the other hand, when the slider 32 is positioned at a lock position, the electronic device unit 1 is in a state (a lock state) where the electronic device unit 1 cannot be coupled with another electronic device unit 1 which has not been coupled, or cannot be separated from another electronic device unit 1 which has been coupled.

The electronic device unit combined with 1 another electronic device unit 1 constitutes a system, and a plurality of electronic device units 1 constituting one system may be handled by coupling the casings thereof. As an example, the electronic device unit 1 is a programmable logic controller and an extension unit. The lock/unlock component 3 includes the slider 32 for switching between a lock state and an unlock state of the electronic device units 1. In a system in which a plurality of the electronic device units 1 are combined together, the electronic device units 1 may be repeatedly separated and coupled when the defected electronic device unit 1 is replaced or the system is reconstructed. Therefore, durability is required for the slider 32 for switching between the lock state and the unlock state of the electronic device units 1. Further, for the sake of downsizing the electronic device unit 1, it is required to reduce the width of the slider 32 for switching between the lock state and the unlock state so as to make the lock/unlock component 3 thinner. The slider 32 of the electronic device unit 1 according to the present embodiment is configured to have high durability and configured as a structure where the width of slider 32 can be reduced, as described later.

Figure 4:
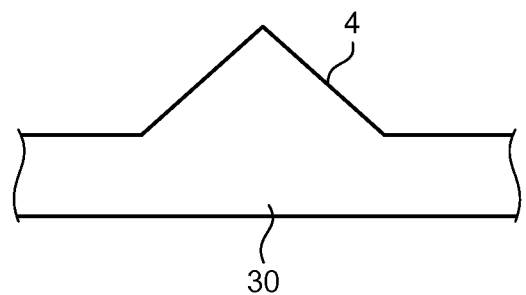
FIG. 4 is a diagram illustrating a protrusion having a cross-sectional shape in which a projecting amount increases at a constant rate up to the maximum and then decreases down to zero.

Although the protrusion 4 is illustrated as having a semicircular cross-sectional shape in the description below, the protrusion 4 may have a shape such that a projecting amount in a width direction continuously increases from zero from one end toward a center, reaches the maximum and decreases continuously down to zero toward the other end. FIG. 4 is a diagram illustrating a protrusion having a cross-sectional shape in which the projecting amount increases at a constant rate, reaches the maximum and decreases at a constant rate down to zero, and thus the protrusion 4 has a triangle cross-sectional shape. Other than the semicircular shape described as an example in the present embodiment and the triangular shape as illustrated in FIG. 4, a semi-elliptical shape, a parabolic shape and the like are a candidate for such a cross-sectional shape whose projecting amount increases at a constant rate, reaches the maximum and decreases at a constant rate down to zero.

Figure 5A:
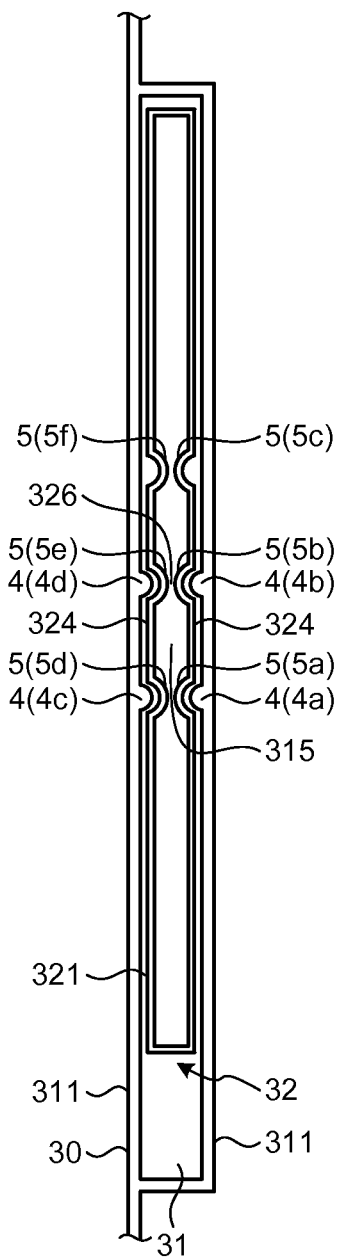
FIG. 5A is a diagram illustrating a change of the lock/unlock component in a deformation state due to movement of the slider.
Figure 5B:
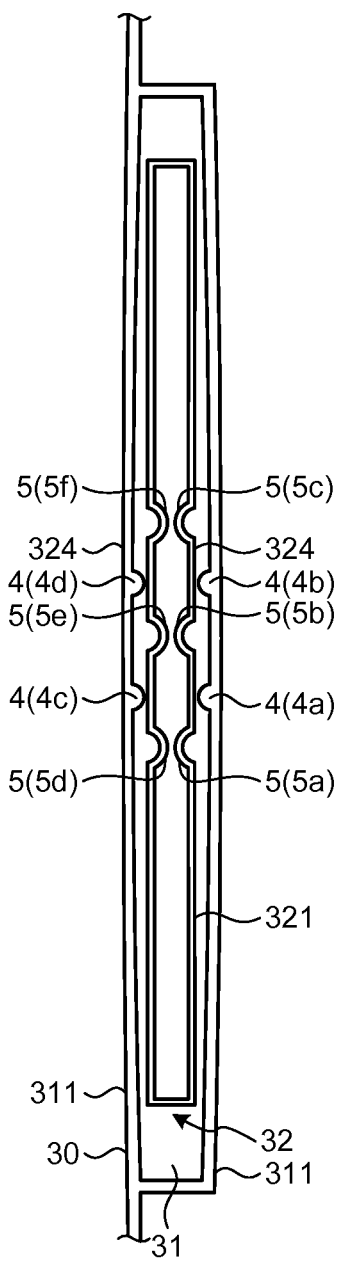
FIG. 5B is a diagram illustrating a change of the lock/unlock component in a deformation state due to movement of the slider.
Figure 5C:
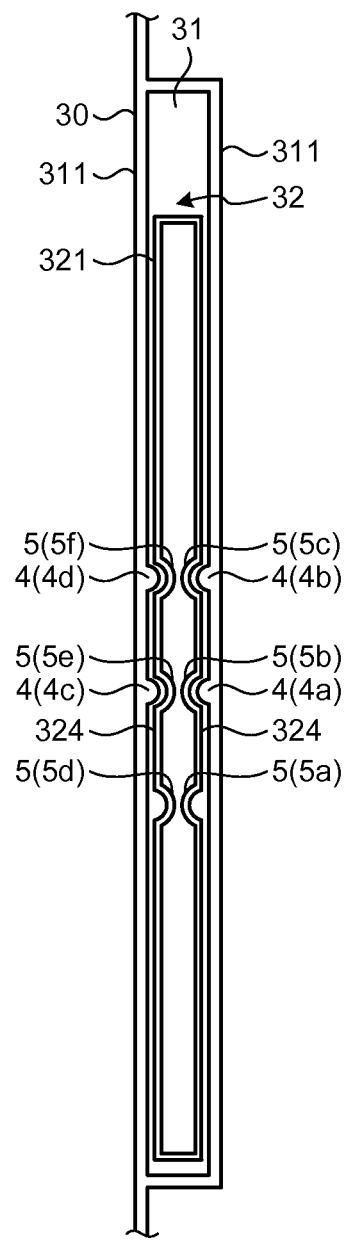
FIG. 5C is a diagram illustrating a change of the lock/unlock component in a deformation state due to movement of the slider.
Figure 6A:
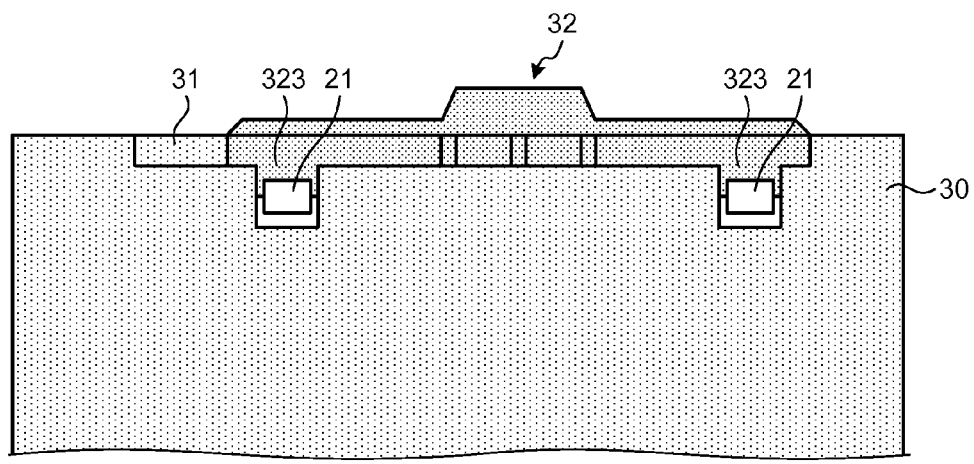
FIG. 6A is a diagram illustrating a positional relation between a bolt and an engagement hole.
Figure 6B:
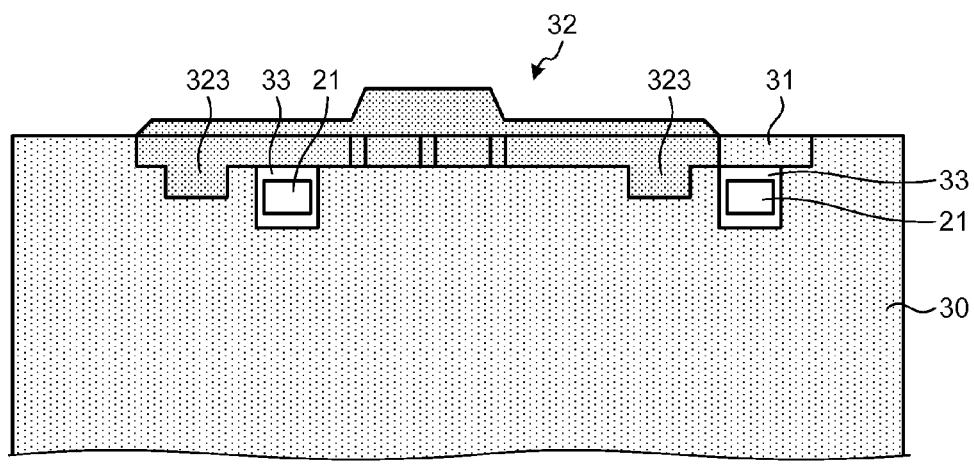
FIG. 6B is a diagram illustrating a positional relation between the bolt and the engagement hole.

FIGS. 5A to 5C are diagrams each illustrating a change of the lock/unlock component in a deformation state due to the movement of the slider. FIG. 5A illustrates a state where the slider 32 is positioned at an unlock position, FIG. 5B illustrates a state where the slider 32 is positioned in the middle of a lock position and the unlock position, and FIG. 5C illustrates a state where the slider 32 is positioned at the lock position. In FIGS. 5A to 5C, to facilitate understanding of deformation of the lid body 31 and the slider 32, cross-sectional surfaces of the lid body 30 and the slider 32 are illustrated to visualize the side face 311 of the guide groove 31 and the sidewall 234 of the body portion 321. FIGS. 6A and 6B are diagrams illustrating a positional relation between a bolt and an engagement hole. FIG. 6A illustrates a state where the slider 32 is at a lock position and FIG. 6B illustrates a state where the slider 32 is at an unlock position.

By sliding the slider 32 at the unlock position along the guide groove 31, the protrusions 4a and 4b run over the concave grooves 5a and 5b and abut on the sidewall 324 of the body portion 321 of the slider 32, and the protrusions 4c and 4d run over the concave grooves 5d and 5e and abut on the sidewall 324 of the body portion 321 of the slider 32. Further, the lid body 30 elastically deforms to enlarge the guide groove 31, and the slider 32 elastically deforms so that the width of the body portion 321 becomes narrowed (FIG. 5A→FIG. 5B). That is, when the slider 32 is located between the lock position and the unlock position, both the sidewalls 324 of the body portion 321 of the slider 32 and both the side faces 311 of the guide groove 31 bend as a whole. When the slider 32 reaches the lock position, the protrusions 4a and 4b are fitted into the concave grooves 5b and 5c, and the protrusions 4c and 4d are fitted into the concave grooves 5e and 5f, by which the elastic deformation of the lid body 30 and the slider 32 is released (FIG. 5B→FIG. 5C). At this time, the movement of the slider 32 is restricted by the engagement between the protrusions 4a and 4b and the concave grooves 5b and 5c, and the engagement between the protrusions 4c and 4d and the concave grooves 5e and 5f, and the slider 32 is held at the lock position. That is, when the slider 32 is located at the lock position, the protrusions 4a and 4b are fitted into the two concave grooves 5b and 5c among the concave grooves 5a, 5b, and 5c on one end side of the guide groove 31, and the protrusions 4c and 4d are fitted into the two concave grooves 5e and 5f among the concave grooves 5d, 5e, and 5f on the one end side of the guide groove 31, by which the movement of the slider 32 is restricted.

As illustrated in FIG. 6A, in a state where the slider 32 is at the lock position, the bolt 323 is located at the front of the engagement hole 33. Therefore, if the coupling hook 21 is inserted into the engagement hole 32, the bolt 323 enters between the engagement hole 33 and the coupling hook 21, thereby preventing the coupling hook 21 from coming out of the engagement hole 33. That is, in a state where the slider 32 is positioned at the lock position, the bolt 323 blocks insertion and removal of the coupling hook 21 into and from the engagement hole 33.

By sliding the slider 32 at the lock position along the guide groove 31, the protrusions 4a and 4b run over the concave grooves 5b and 5c and abut on the sidewall 324 of the body portion 321 of the slider 32, and the protrusions 4c and 4d run over the concave grooves 5e and 5f and abut on the sidewall 324 of the body portion 321 of the slider 32. Further, the lid body 30 elastically deforms to enlarge the guide groove 31, and the slider 32 elastically deforms so that the width of the body portion 321 becomes narrowed (FIG. 5C→FIG. 5B). That is, when the slider 32 is located between the lock position and the unlock position, both the sidewalls 324 of the body portion 321 of the slider 32 and both the side faces 311 of the guide groove 31 bend as a whole. When the slider 32 reaches the unlock position, the protrusions 4a and 4b are fitted into the concave grooves 5a and 5b, and the protrusions 4c and 4d are fitted into the concave grooves 5d and 5e, by which the elastic deformation of the lid body 30 and the slider 32 is released (FIG. 5B→FIG. 5A). At this time, the movement of the slider 32 is restricted by the engagement between the protrusions 4a and 4b and the concave grooves 5a and 5b, and the engagement between the protrusions 4c and 4d and the concave grooves 5d and 5e, and the slider 32 is held at the unlock position. That is, when the slider 32 is located at the unlock position, the protrusions 4a and 4b are fitted into the two concave grooves 5a and 5b among the concave grooves 5a, 5b, and 5c on the other end side of the guide groove 31, and the protrusions 4c and 4d are fitted into the two concave grooves 5d and 5e among the concave grooves 5d, 5e, and 5f on the other end side of the guide groove 31, by which the movement of the slider 32 is restricted.

As illustrated in FIG. 6B, in a state where the slider 32 is at the unlock position, the bolt 323 is not located at the front of the engagement hole 33. Therefore, the coupling hook 21 can be inserted into or removed from the engagement hole 33. That is, in a state where the slider 32 is at the unlock position, the bolt 323 does not block insertion and removal of the coupling hook 21 into and from the engagement hole 33.

Figure 7:
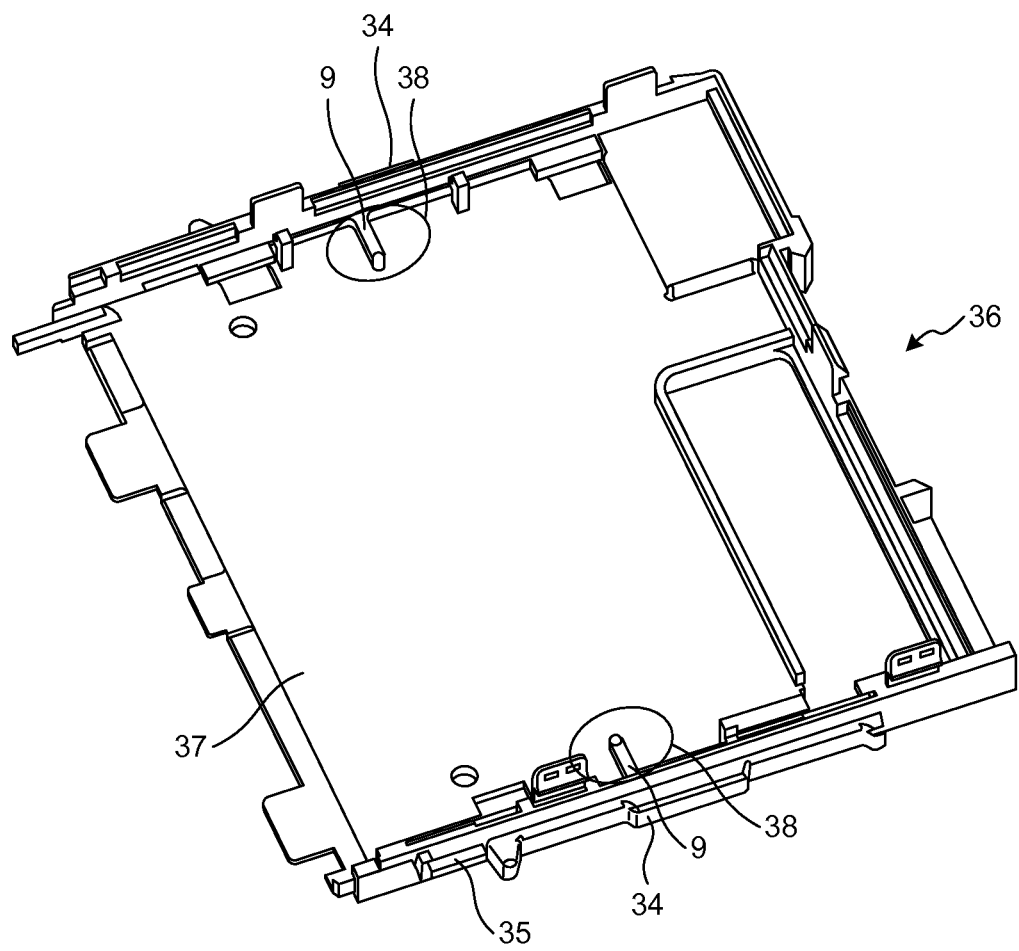
FIG. 7 is a diagram illustrating a structure of a lock/unlock component for fixing a slider at a lock position by an arm.

For comparison, a structure of a lock/unlock component in which a slider is fixed to a lock position by an arm is described. FIG. 7 is a diagram illustrating a structure of a lock/unlock component in which a slider is fixed to a lock position by an arm. A lock/unlock component 36 has a lid body 37 and a slider 34. The slider 34 is provided in a guide groove 35 formed in the lid body 37. An arm 9 is formed on the slider 34. The arm 9 moves along with the movement of the slider 34. However, because a movable range 38 of the arm 9 needs to be a component-mounting prohibited region in which an electronic component or the like cannot be provided, there is a dead space inside a case. Because the arm 9 is in a shape of a cantilever, stress generated by a force for bending the arm 9 becomes largest at a base portion of the arm 9. Therefore, in order to ensure the strength, while maintaining the spring property of the arm 9, the arm 9 needs to have a certain length and thickness. By forming the arm 9 to be long and thick, the movable range 38 of the arm 9 increases, thereby enlarging the component-mounting prohibited region.

On the other hand, in the lock/unlock component according to the present embodiment, when the slider 32 is located between a lock position and an unlock position, the sidewalls 324 of the body portion 321 of the slider 32 bends as a whole. That is, because the sidewalls 324 of the body portion 321 of the slider 32 function as a spring as a whole, a force generated at the time of elastic deformation can be dispersedly received, thereby enabling to improve the strength. Further, because both the body portion 321 of the slider 32 and the lid body 30 elastically deform, wear of the protrusion 4 can be suppressed.

Two protrusions 4 are provided on each side face 311 of the guide groove 31. Even if one of the protrusions 4 is worn away, the slider 32 can be surely fixed at a lock position and an unlock position without fail as long as the other protrusions are still usable. Further, because a contact area is large as compared to a case of only one protrusion 4, the wear of the protrusions 4 can be suppressed. Because the protrusions 4 and the concave grooves 5 are fitted to each other on both sides of the slider 32, the slider 32 can be fixed more reliably at the lock position and the unlock position, as compared to a case where the protrusions and the concave grooves are provided only on one side of the slider. It is also possible to provide the protrusions 4 and the concave grooves 5 only on one side face of the guide groove 31 and the slider 32.

Because the arm itself is not present on the slider 32, the component-mounting prohibited region does not need to be ensured in the movable range of the arm, and the space inside the case 2 can be used effectively. Further, a stepped shape for engagement with the arm does not need to be formed outside of the coupling surface of the case 2, and the case can have a simple shape.

Figure 8A:
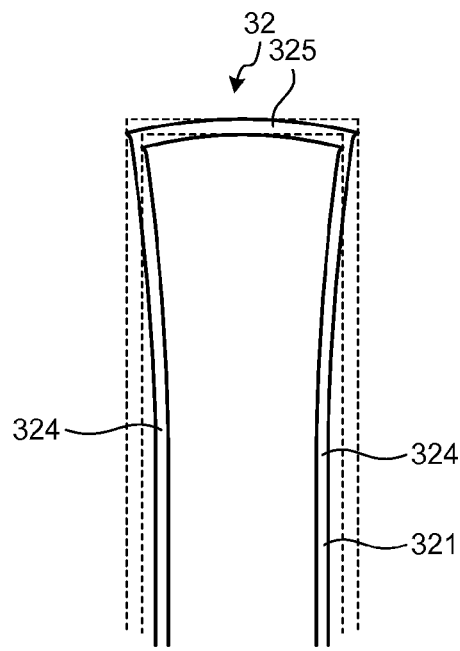
FIG. 8A is a diagram schematically illustrating deformation of a slider.
Figure 8B:
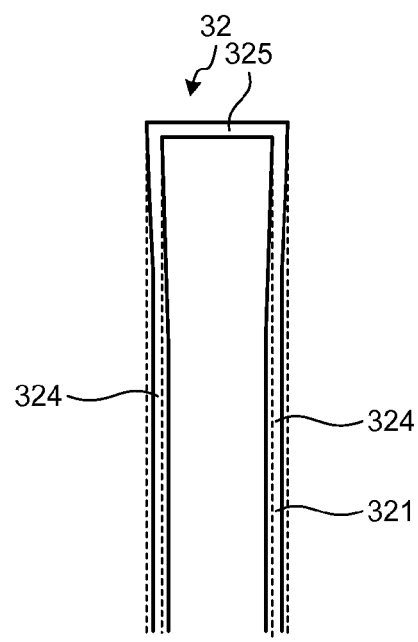
FIG. 8B is a diagram schematically illustrating deformation of the slider.

Reasons why it is better to provide the concave groove 5 rather than a protrusion on the sidewall 324 of the body portion 321 of the slider 32 are described here. FIG. 8A and FIG. 8B are diagrams schematically illustrating deformation of a slider. FIG. 8B illustrates deformation of a slider having a narrower width as compared to a slider illustrated in FIG. 8A. In FIG. 8A and FIG. 8B, a dotted line illustrates the shape of the slider 32 before deformation, and a solid line illustrates the shape of the slider 32 after deformation. If anteroposterior walls 325 are long, the anteroposterior walls 325 of the body portion 321 largely contribute to the elastic deformation of the slider 32. Meanwhile, if the anteroposterior walls 325 are short, the anteroposterior walls 325 of the body portion 321 does not largely contribute to the elastic deformation of the slider 32, and the sidewalls of the body portion 321 of the slider 32 are hardly deformed elastically. If a protrusion is provided on the sidewall 324 of the body portion 321 of the slider 32, in order to set the width of the slider 32 as a whole to be equal to a case where a concave groove is provided on the sidewall 324 of the body portion 321 of the slider 32, the anteroposterior walls 325 need to be shortened by as much as the height of the protrusion. Further, if a protrusion is provided on the sidewall 324 of the body portion 321 of the slider 32, stiffness of the sidewall 324 of the body portion 321 becomes high. Due to these reasons, if a protrusion is provided on the sidewall 324 of the body portion 321 of the slider 32, the sidewall 324 of the body portion 321 of the slider 32 is hardly deformed elastically.

From the viewpoint of downsizing of the device, it is preferable to reduce the widths of the slider 32 and the guide groove 31 and make the lock/unlock component 3 thinner. However, if a protrusion is provided on the sidewall 324 of the body portion 321 of the slider 32, the lengths of the anteroposterior walls 325 need to be reduced more than the width of the guide groove 31 by as much as the height of the protrusion. Accordingly, the anteroposterior walls 325 become less contributable to the elastic deformation of the slider 32, and the sidewall 324 itself has higher stiffness making it less deformable. Therefore, if a protrusion is provided on the sidewall 324 of the body portion 321 of the slider 32, it may become difficult to reduce the width of the slider 32 in order to ensure a deformation amount of the sidewall 324 of the body portion 321.

As illustrated in FIG. 2 and the like, according to the present embodiment, because the concave grooves 5 are provided on the sidewalls 324 of the body portion 321 of the slider 32, the anteroposterior walls 325 can have substantially the same width as the guide groove 31. Accordingly, if the width of the guide groove 31 is the same, the length of the anteroposterior walls 325 can be set longer as compared to a case where a protrusion is provided on the sidewalls 324 of the body portion 321 of the slider 32. Therefore, by providing the concave grooves 5 on the sidewalls 324 of the body portion 321 of the slider 32, the anteroposterior walls 325 of the body portion 321 of the slider 32 can largely contribute to the elastic deformation of the slider 32. In other words, if the deformation amount of the sidewalls 324 of the body portion 321 is ensured by the same amount, the width of the slider 32 can be reduced by providing the concave grooves 5 on the sidewalls 324 of the body portion 321 of the slider 32 than a case where the protrusions are provided on the sidewalls 324 of the body portion 321 of the slider 32. Accordingly, because the width of the guide groove 31 can be reduced also, the lock/unlock component 3 can be made thinner easily by providing not the protrusions but the concave grooves 5 on the sidewalls 324 of the body portion 321 of the slider 32.

The guide groove 31 may be configured to have a rotationally symmetric shape whose rotation axis is an axis passing the center of a bottom face and parallel to a side face, and the slider 32 may be configured to have a rotationally symmetric shape whose rotation axis is an axis passing the center of the body portion 321 and parallel to the sidewall 324. By these configurations, it is not required to match the direction of the slider 32 with a specific direction when the slider 32 is installed in the guide groove 31, and thus an assembly work is facilitated. The description is supplemented by using FIG. 5A as an example. The guide groove 31 may be configured to have a rotationally symmetric shape whose rotation axis is an axis passing a center 315 of a bottom face of the guide groove 31 and parallel to the side face 311, and the slider 32 may be configured to have a rotationally symmetric shape whose rotation axis is an axis passing a center 326 of the body portion 321 and parallel to the sidewall 324. By these configurations, the slider 32 can be fixed at a lock position and an unlock position even if the slider 32 is provided in the guide groove 31 in a direction in which the protrusions 4a and 4b face the concave grooves 5d, 5e, and 5f and the protrusions 4c and 4d face the concave grooves 5a, 5b, and 5c. Owing to such structure, an assembly work can be performed without concerning the orientation of the slider 32, thereby improving assemblability.

According to the present embodiment, the sidewalls 324 of the body portion 321 of the slider 32 is made to function as a spring as a whole to dispersedly receive a force generated at the time of elastic deformation of the sidewalls 324, the strength of the slider 32 can be improved. Further, wear of the protrusions 4 can be suppressed by causing both the body portion 321 of the slider 32 and the lid body 30 to deform elastically. Accordingly, at the time of constructing a system, the durability of components to be used by a mechanism that locks or unlocks electronic device units in a lateral direction can be improved. Further, because an arm itself is not present on the slider 32, it is not needed to secure a component-mounting prohibited region in the movable range of the arm, thereby enabling to decrease restriction in the internal degree of freedom in electronic device unit 1.

In the above example, a case has been described where three concave grooves 5 are provided on the side of the slider 32 and two protrusions 4 are provided on the side of the guide groove 31. However, the numbers of the concave grooves 5 and the protrusions 4 may be further increased so as to satisfy a numerical relation such that the number of the concave grooves 5 is larger than that of the protrusions 4. For example, by setting the number of concave grooves 5 to six and the number of protrusions 4 to four to have the concave grooves 5 two more than the protrusions 4, such a structure can be realized that the protrusions 4 are fitted into central two of the six concave grooves 5 in both cases where the slider 32 is at a lock position and where the slider 32 is at an unlock position. Further, the respective numbers of the concave grooves 5 and the protrusions 4 can be integral multiples of the numbers in the above example. In the above example, the protrusion 4 is fitted into a part (one at the center) of the three concave grooves 5 in both cases where the slider 32 is at a lock position and where the slider 32 is at an unlock position. However, the number of concave grooves 5 can be set to twice the number of protrusions 4, so that the concave grooves 5 fitted with the protrusions 4 when the slider 32 is at a lock position are made different from the concave grooves 5 fitted with the protrusions 4 when the slider 32 is at an unlock position. However, if the number of concave grooves 5 is larger than that of the protrusions 4 by two or more, the movement of the slider 32 is restricted by the fitting of the concave grooves 5 and the protrusions 4 even at an intermediate position between a lock position and an unlock position. If such a numerical relation is satisfied that the number of concave grooves 5 is larger than the number of protrusions 4 by one, restriction in the movement of the slider 32 at an intermediate position between a lock position and a unlock position can be prevented.

INDUSTRIAL APPLICABILITY

As described above, the side-coupling-type electronic device unit according to the present invention is useful in terms of having less restriction in the internal degree of freedom thereof, and is particularly suitable in constructing a system with multistage coupling.

REFERENCE SIGNS LIST 1 electronic device unit, 2 case, 3, 36 lock/unlock component, 4, 4a, 4b, 4c, 4d protrusion, 5, 5a, 5b, 5c, 5d, 5e, 5f concave groove, 9 arm, 21 coupling hook, 30, 37 lid body, 31, 35 guide groove, 32, 34 slider, 33 engagement hole, 38 movable range, 311 side face, 315 center of bottom face of guide groove, 321 body portion, 322 operation portion, 323 bolt, 324 sidewall, 325 anteroposterior wall, 326 center of body portion.

The invention claimed is:

1. A side-coupling-type electronic device unit comprising: a casing including:
    a coupling hook provided projectingly on a coupling surface to be coupled with another electronic device unit;
    an engagement hole into which a coupling hook of the another electronic device unit is capable of being inserted; and
    a guide groove; and
    a slider that includes a bolt, that is installed in the guide groove, and that moves between a lock position located at one end side of the guide groove at which the bolt is capable of blocking insertion and removal of the coupling hook of the another electronic device unit into and from the engagement hole, and an unlock position located at another end side of the guide groove at which the bolt is not capable of blocking insertion and removal of the coupling hook of the another electronic device unit into and from the engagement hole, wherein
    the guide groove has two convex shaped portions on a side face thereof,
    the slider has three concave shaped portions, into which the two convex shaped portions are capable of being fitted, on a side face thereof,
    when the slider is located at the lock position, the two convex shaped portions are fitted into two of the three concave shaped portions on one end side of the guide groove so as to restrict movement of the slider, and
    when the slider is located at the unlock position, the two convex shaped portions are fitted into two of the three concave shaped portions on the other end side of the guide groove so as to restrict movement of the slider.

2. The side-coupling-type electronic device unit according to claim 1, wherein
    the two convex shaped portions are respectively provided on both side faces of the guide groove, and
    the three concave shaped portions are respectively provided on both side faces of the slider.

3. The side-coupling-type electronic device unit according to claim 2, wherein when the slider is located between the lock position and the unlock position, both the side faces of the slider and both the side faces of the guide groove bend as a whole.

4. The side-coupling-type electronic device unit according to claim 1, wherein the convex shaped portion has a shape in which a projecting amount in a width direction from one end toward a center continuously increases from zero and reaches the maximum, and a projecting amount in the width direction toward the other end continuously decreases down to zero.

5. The side-coupling-type electronic device unit according to claim 1, wherein
    the casing includes a box-like case having an open face, and a lid-like lock/unlock component that covers the open face of the case,
    the engagement hole and the guide groove are formed in the lock/unlock component, and
    the case includes the coupling hook.

* * * * *